United States Patent
Witzke et al.

(10) Patent No.: US 7,257,093 B1
(45) Date of Patent: Aug. 14, 2007

(54) LOCALIZED RADIO FREQUENCY COMMUNICATION USING ASYNCHRONOUS TRANSFER MODE PROTOCOL

(75) Inventors: Edward L. Witzke, Edgewood, NM (US); Perry J. Robertson, Albuquerque, NM (US); Lyndon G. Pierson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 928 days.

(21) Appl. No.: 09/975,271

(22) Filed: Oct. 10, 2001

(51) Int. Cl.
*H04B 7/00* (2006.01)

(52) U.S. Cl. .................. 370/310.1; 455/90.3

(58) Field of Classification Search .......... 370/310, 370/310.1; 455/90.1, 90.3
See application file for complete search history.

(56) References Cited

U.S. PATENT DOCUMENTS

| | | | | |
|---|---|---|---|---|
| 5,621,913 A | * | 4/1997 | Tuttle et al. .......... | 455/41.2 |
| 5,754,948 A | * | 5/1998 | Metze ................ | 455/41.2 |
| 6,690,670 B1 | * | 2/2004 | Castellano ........... | 370/395.1 |
| 6,771,935 B1 | * | 8/2004 | Leggett .............. | 455/66.1 |
| 2002/0183013 A1 | * | 12/2002 | Auckland et al. ..... | 455/73 |
| 2004/0202179 A1 | * | 10/2004 | Tan et al. ........... | 370/395.1 |
| 2004/0240190 A1 | * | 12/2004 | Hsu et al. ........... | 361/797 |
| 2005/0095747 A1 | * | 5/2005 | Khorram ............. | 438/106 |

OTHER PUBLICATIONS

Harry Newton, 'Newton's Telecom Dictionary', 9th Edition, Sep. 1995, Flatiron Publishing, Inc., definition TDMA, p. 1111.*
Mau-Chung, Frank Chang et al., 'RF/Wireless Interconnect for Inter-and Intra-Chip Communications', Proceedings of the IEEE, vol. 89, No. 4, Apr. 2001, pp. 456-466.*
Harry Newton, 'Newton's Telecom Dictionary', 9th Edition, Sep. 1995, Flatiron Publishing, Inc., definition of 'packet', p. 828.*

* cited by examiner

Primary Examiner—Melvin Marcelo
(74) Attorney, Agent, or Firm—Madelynne J. Farber

(57) ABSTRACT

A localized wireless communication system for communication between a plurality of circuit boards, and between electronic components on the circuit boards. Transceivers are located on each circuit board and electronic component. The transceivers communicate with one another over spread spectrum radio frequencies. An asynchronous transfer mode protocol controls communication flow with asynchronous transfer mode switches located on the circuit boards.

19 Claims, 2 Drawing Sheets

LOCALIZED RADIO FREQUENCY COMMUNICATION USING ASYNCHRONOUS TRANSFER MODE PROTOCOL

GOVERNMENT RIGHTS

The Government has rights to this invention pursuant to Contract No. DE-AC04-94AL85000 awarded by the U.S. Department of Energy.

BACKGROUND OF THE INVENTION

1. Field of the Invention (Technical Field)

The present invention relates to wireless communication between electronic circuit boards and between circuit components on circuit boards.

2. Background Art

Printed circuit boards provide for the interconnection of a variety of electronic components such as integrated circuits (ICs), application specific integrated circuits (ASICs), and programmable logic devices (PLDs). Communication amongst these components is typically accomplished through etched copper traces in the circuit board. These fixed communication paths limit the flexibility of a given circuit board design, even if implemented with the latest programmable logic devices, to be reconfigured for multiple uses. Changes in the communication paths require redesign and manufacturing of a new circuit board, an expensive and time consuming proposition.

Communication between individual printed circuit boards is achieved by hardwiring one board to the next with conductive wires and mechanical connectors that connect input and output (I/O) pins on one circuit board to the next. As more data is moved between printed circuit boards at higher transmission rates, board-to-board communication becomes increasingly difficult. A high number of I/O pins in connectors having limited space can lead to connector failure, and a high density of I/O pins operating at high speeds can lead to crosstalk and errors between data lines.

One limitation encountered in printed circuit wiring technology and wire connections from one circuit board to the next is that the transmission paths from one electronic component to the next or from one circuit board to the next, once defined, cannot change. The etched copper traces and the wiring configurations are established during the manufacturing process and these paths then remain fixed. Highly integrated PLDs have been developed to combat the problem of hard coded digital logic in digital logic gates, but these devices offer only a partial solution to the problem of inflexible interconnects. A solution is needed that provides reconfigurable interconnects amongst electronic components on circuit boards as well as between circuit boards so that the destination of transmitted information can be controlled, and communication made more efficient.

One method of communicating electrical signals from one circuit board to the next is by free space optical communications. Free space optical communications, such as laser communication, eliminate the need for etched copper traces or hardwire connections, thereby increasing the reconfigurability of the communication transmission path. However, while these techniques have been demonstrated, they are inherently difficult to implement because of the need for tight alignment tolerances between sending and receiving units. There must be a clear transmission path from the transmitter to the receiver to inhibit interference so that the receiver can accurately receive the transmission.

One type of communication scheme that is typically used for communicating over extended distances includes radio frequency (RF) communications. Radio frequencies are used to transmit information from one remote location to another, such as from a radio station transmitter to an individual radio. Basically, a transmitter transmits a modulated signal at radio frequencies to a receiver that receives and demodulates the signal into a frequency band that can be used to communicate information in the signal to the receiving entity. For example, the received signal may be converted into an electrical signal for transmission to an audio speaker.

With the advent of silicon integrated circuits, it is now possible to reduce RF transceiver circuitry into single chip components. This has enabled the use of RF communications for digital data exchange between small hand-held devices such as Personal Data Assistants (PDAs). These same components can be used to provide reconfigurable communication routing between electronic components on circuit boards and between circuit boards.

Complex communication systems, whether RF or conventional communication systems on and across circuit boards, require management of information flow. A variety of protocols have evolved to control signal routing and flow. The asynchronous transfer mode (ATM) communication protocol is one such methodology for controlling communication flow between two or more sites. ATM networks are more fully described in: Martin DePrycker, *Asynchronous Transfer Mode*, $2^{nd}$ Edition, Ellis Horwood, Ltd. (1993), and Abhijit S. Pandya and Ercan Sen, *ATM Technology for Broadband Networks*, CRC Press (1999). The entire disclosures of these references are herein incorporated by reference.

The present invention solves the problems encountered in prior art circuit board communication by implementing low power RF as the communication means, thereby enabling reconfigurable communication paths between circuit boards and between electronic circuit components on circuit boards. An ATM protocol is used to control communication flow.

SUMMARY OF THE INVENTION
(DISCLOSURE OF THE INVENTION)

The present invention is a localized wireless communication system for communication between a plurality of circuit boards, where each of the circuit boards has at least one electronic component located on the board. Each circuit board is provided a miniature transceiver to enable radio frequency communication between the circuit boards. Preferably, the radio frequency communication is in the range of approximately 2.5 GHz to 5 GHz, or within an Industrial, Scientific and Medical (ISM) band. The range of RF transmission is between 1 millimeter and 100 centimeters and transmission power is between approximately 1 microwatt and 1 milliwatt. An asynchronous transfer mode switch is provided on each circuit board as an integrated circuit chip (referred to as an "ATM switch-chip") to control the flow of communication in the asynchronous transfer mode protocol. Electrical signals from each circuit board are modulated into radio frequency signals for transmission by the transceivers. Preferably, spread spectrum modulation is used to modulate the communication signals. Demodulators are used to demodulate the received RF communication signals into electrical signals for use by the circuit boards.

The present invention further comprises transceivers associated with the electronic components on the circuit boards. The component transceivers enable radio frequency communication between circuit board components or across circuit boards via ATM switch-chips. RF signals that are received by the component transceivers are demodulated into electrical signals and input into the appropriate I/O address of the circuit board component. Electrical signals output from circuit board components are modulated into RF signals for transmission by the component transceivers to the appropriate address.

In a second embodiment, the ATM switch-chips are eliminated and circuit board components communicate directly with one another through RF transmissions.

In a third embodiment, the present invention is implemented as a switch, effectively eliminating the backplane of a conventional ATM switch. A conventional input signal, such as an electrical, optical or RF signal, is received by each input port and converted into an RF signal addressed to the appropriate output port. Upon receiving the appropriately addressed RF signal, the output port converts the signal into a conventional output signal for transmission to the final destination.

A primary object of the present invention is to alleviate communication problems such as capacitive loading, crosstalk, system clock distribution, and clock and data skew encountered in prior art circuit board architecture using hardwire connections and etched copper traces. The present invention enables circuit board and circuit board component interconnection reconfigurability through the use of miniature wireless interfaces augmented by ATM protocols, frequency management, and spread spectrum communication techniques.

A primary advantage of the present invention is that it provides high-speed, noise-free connections between circuit boards and circuit board components. Another primary advantage of the present invention is that communication paths between electronic components and between circuit boards can be reconfigured. Another advantage of the present invention is the elimination of mechanical difficulties that accompany mechanical connectors having high pin densities that are used to interconnect circuit boards. Still another advantage of the present invention is a reduction in signal routing, capacitive loading, crosstalk, and clock and data skew difficulties encountered in prior art methods of etched copper trace and hardwire connections. Still yet another advantage of the present invention is improved cooling of multi-circuit board configurations. Large, multipin connectors used to connect multiple data paths between circuit boards inhibit the flow of cooling air. Wireless coupling of circuit boards eliminates the obstruction of airflow between circuit boards. Still yet another advantage of the present invention is that when combined with programmable logic devices, both digital logic and communication paths between PLDs can be reconfigured. This provides greater flexibility than available in the prior art, particularly when building prototypes and design circuits.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate embodiments of the present invention and, together with the description, serve to explain the principles of the invention. The drawings are only for the purpose of illustrating preferred embodiments of the invention and are not to be construed as limiting the invention. In the drawings.

DESCRIPTION OF THE PREFERRED EMBODIMENTS

Best Modes for Carrying out the Invention

The present invention employs low power RF technology to communicate between electronic circuit boards, between components on electronic circuit boards, and to effect switching of signals between destinations. ATM protocols are used to manage message transfers and to delineate information data packets. Miniature RF transceivers communicate using ATM protocols, rather than wired connections between circuit boards and etched copper trace interconnects. RF communication links enable communication paths to be reconfigured as necessary to support changing functions and applications.

Figure 1:
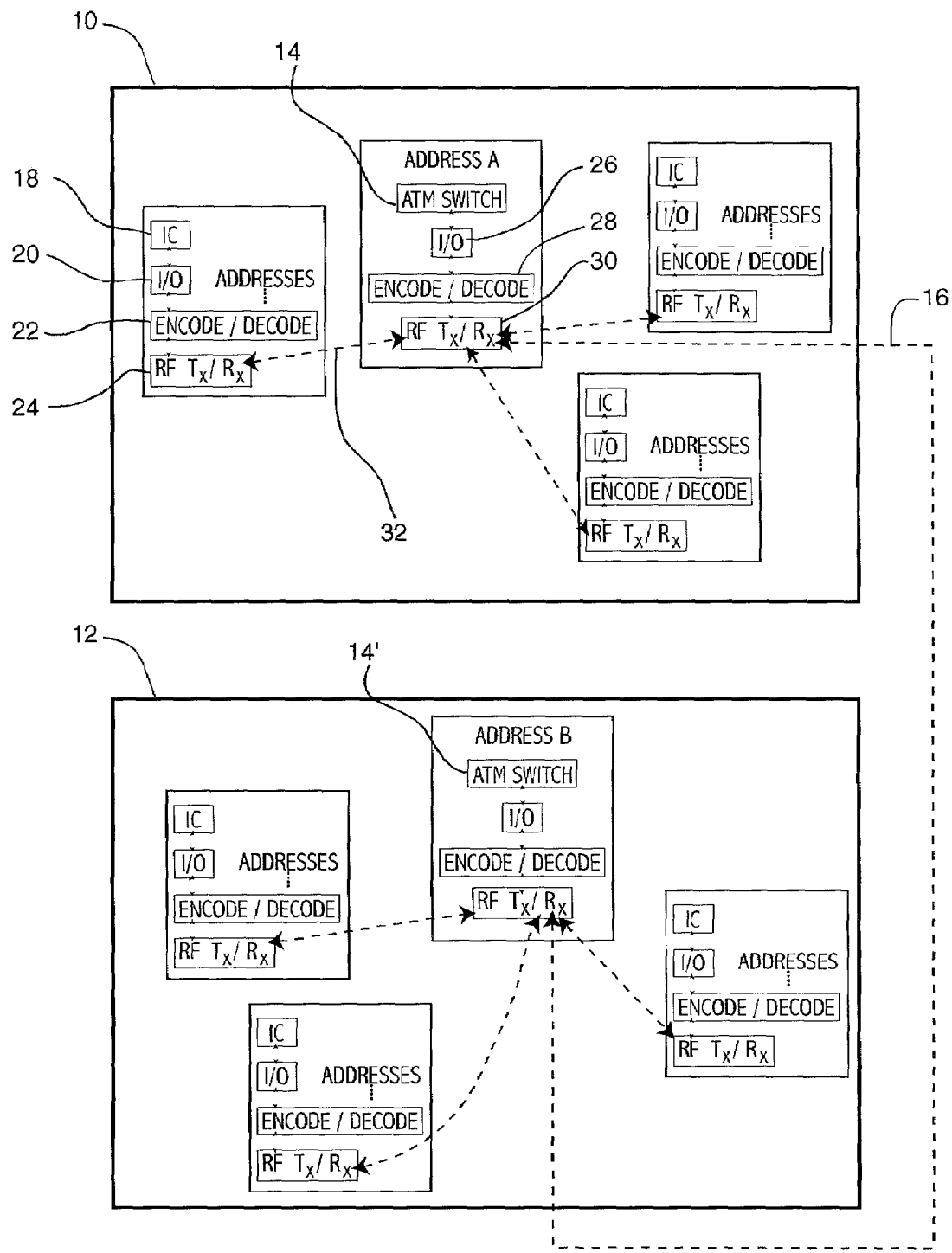
FIG. 1 is a schematic diagram of two circuit boards, each of which communicates via an ATM protocol over radio frequencies between ATM switch-chips and circuit components on each circuit board, and between the ATM switch-chips on each circuit board, in accordance with the present invention.

Referring to FIG. 1, a schematic diagram illustrates two circuit boards 10 and 12 on which the present invention is implemented. Circuit boards 10 and 12 each comprise an ATM switch 14 and a variety of circuit board components such as the IC shown at 18. Each ATM switch 14 is implemented in an integrated circuit chip, such as an application specific integrated circuit (ASIC) or PLD, (referred to hereinafter as an "ATM switch-chip") and is mounted onto the circuit board. ATM switch-chips 14 and 14' communicate with one another (as well as with other ATM switches not shown in FIG. 1) over RF transmission link 16. The modulation scheme for RF transmission can be any of a multitude of commonly used modulation schemes including, but not limited to Frequency Modulation (FM), Phase Modulation (PM), Amplitude Modulation (AM) and combinations such as Quadature Amplitude Modulation (QAM). The transmitted signal is encoded to accomplish spreading of the carrier frequency using a digital spreading code, or frequency hopping, commonly referred to as "spread spectrum." Preferably, encoding for detecting and/or correcting transmission errors is also applied to the communication signal data. Preferably, ATM Private Network to Network Interface (PNNI) signaling and messages are exchanged over RF link 16 between interboard ATM switch-chips 14 and 14' to establish the necessary communication paths between ATM switch-chips and to maintain those paths. Once a path is established, communication flows between ATM switch-chips over the path. While FIG. 1 demonstrates just two circuit boards 10 and 12, it is to be understood that the present invention can be implemented across any number of circuit boards.

ATM switch-chip 14 also communicates with ICs located on the same circuit board via spread spectrum RF transmission links, such as shown at 32. Preferably, each IC 18 communicates with the ATM switch-chip 14 located on the same circuit board via paths created and maintained by ATM User to Network (UNI) signaling and messages. The inputs and outputs 20 from each IC 18 connect to integrated RF transceiver 24. Each transceiver 24 transmits and receives communication data signals between ICs via the ATM switch-chip.

Each individual IC I/O connection is assigned an ATM address, and the ATM switch-chip routes signals from one IC to another, or from one circuit board to another, according to the ATM address provided by the sending IC and contained in the transmitted signal. (The configuration can be analogized to a cellular telephone communication system wherein the ATM switch-chip is analogous to the cellular telephone tower, each IC is analogous to individual cellular telephones and each circuit board defines a service cell. Alternatively, several adjacent circuit boards can comprise a single cell when under the control of a single ATM switch-chip.) Transceivers 24 comprise small antennas protruding from each IC or are etched directly onto the printed circuit board. When directly etched onto the circuit board, a conventional IC I/O pin connects IC 18 to the antenna.

Clock distribution is achieved by incorporating a separate clock channel over each circuit board or alternatively is implemented by recovering the timing signal from each incoming data stream. The distance between transmitter and receiver determines clock skew across the circuit board. Because RF signals travel through free space at the rate of approximately one foot per nanosecond, a 12-inch square circuit board would encounter a clock skew of less than 500 picoseconds. Due to the diminutive size of electronic circuit boards, the present invention provides the ability to send the timing signal anywhere on the circuit board regardless of the data path. Distribution of the timing signal need not necessarily use the ATM protocol, but can be implemented in any manner known in the art.

Electrical signals from each IC 18 are input into IC 18 and output from IC 18 via I/O pins 20, each I/O pin having a unique ATM address. Electrical signals that are output from IC 18 are modulated for RF transmission by an encoder that is shown as part of an encode/decode block shown at 22 on FIG. 1. After the signal is modulated for RF transmission, it is transmitted by RF transceiver 24 to the appropriate address via ATM switch-chip 14. RF signals that are transmitted to IC 18 are received by RF transceiver 24 and are demodulated, as represented by the encode/decode block 22 on FIG. 1. The demodulated signal is then input to the correct I/O address into IC 18.

ATM switch-chip 14 receives and transmits communication data signals in a similar manner. RF signals that are received by ATM switch-chip 14 for routing to the appropriate address are received by RF transceiver 30. The received signal is then demodulated by the encode/decode block represented at 28 in FIG. 1. The demodulated signal is then input into the ATM switch-chip 14 to be routed to the appropriate address. ATM switch-chip 14 transmits the communication signal to the appropriate address by sending it out through its I/O port 26 to be modulated into an RF signal for transmission, which is indicated by the encode/decode block at 28 of FIG. 1. RF transceiver 30 transmits the communication signal to the IC having the appropriate address. ATM switch-chip 14 communicates with the ICs on the same circuit board upon which the ATM switch-chip is located, as well as with ATM switch-chips located on other circuit boards in the vicinity. When a communication signal is to be sent to an IC on a different circuit board, ATM switch-chip 14 transmits the signal to the ATM switch-chip on the appropriate circuit board, which in turn routes the signal to the appropriate IC I/O address.

In a second embodiment of the present invention, ATM switching and communication protocol is eliminated and interboard and intraboard communications take place directly through RF transmissions between circuit board components. Communication signals are "addressed" according to frequency and/or according to an encoding scheme to the appropriate IC I/O connection.

Figure 2:
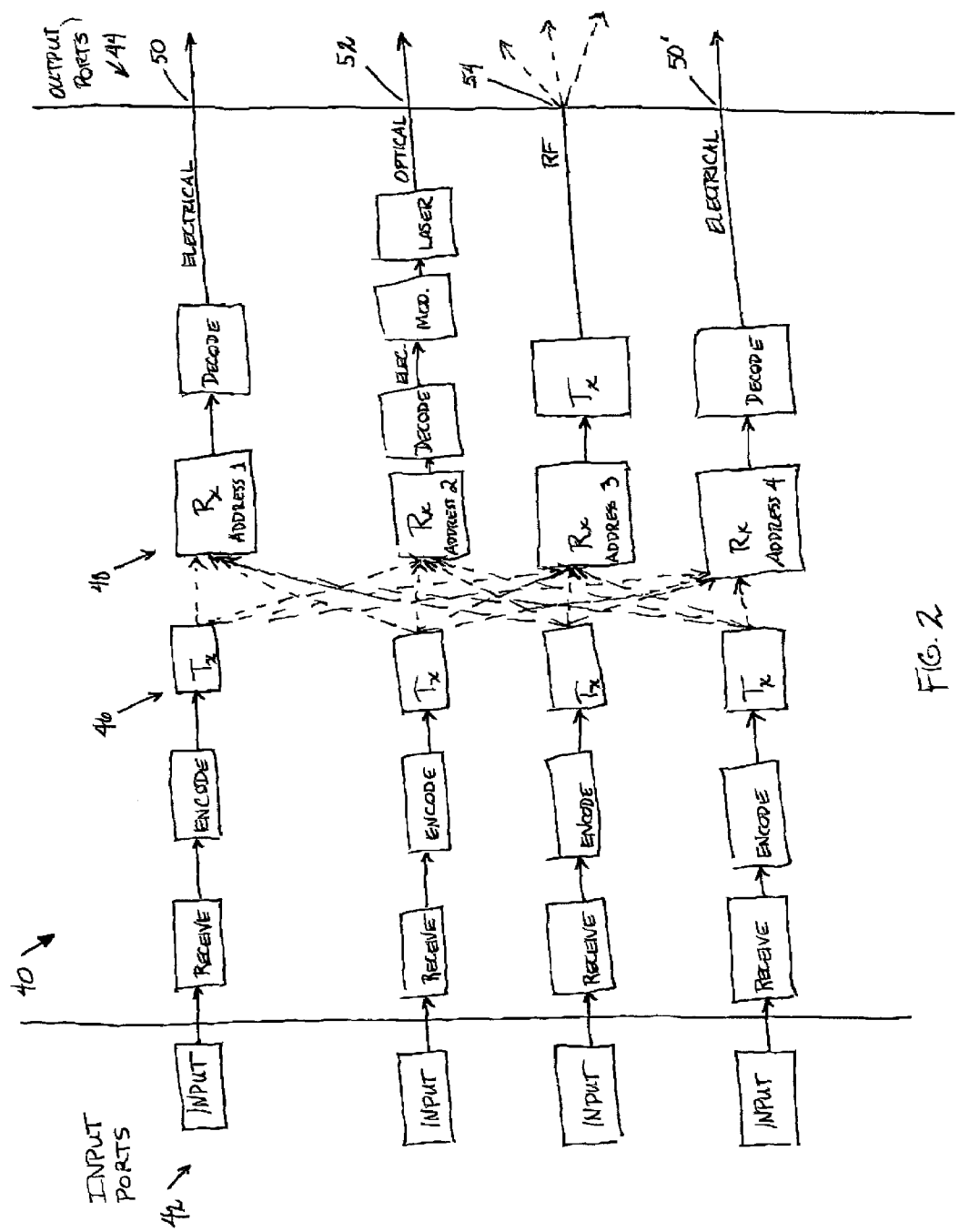
FIG. 2 is a schematic diagram of the present invention for a switch wherein signals to each input port are routed to the appropriate output port by an RF transmission addressed according to output port.

In a third embodiment, the backplane of an ATM switch is eliminated. In this embodiment, low power transmitters and receivers are used as in the first two embodiments and the switch circuit board is shielded against RF emissions to inhibit RF interference from the environment external to the switch and to inhibit the switching signals from entering the external environment. Communication data signals, such as ATM information cells, are input to and output from the circuit board through the circuit board I/O ports via any conventional means, such as fiber optics, twisted copper wire pairs, or RF transmission, but are routed via RF transmissions. This embodiment eliminates the need for a crossbar or other electronic switching matrix mechanism that is typically used in the backplane of prior art ATM switches. (Other functions of ATM switching, such as connection establishment and management, "quality of service" negotiation, and other ATM functions are still performed as required.) Referring to FIG. 2, a schematic diagram demonstrates switch 40 implementing the principles of the invention. Switch 40 has four input ports 42 and four output ports 44. Signals to input ports 42 are conventional signals such as electrical, optical, or RF signals, and contain address data for the final destination. Each input signal that is not in the form of an RF signal, such as electrical or optical input, is encoded to an RF signal with the appropriate output port address according to the address data in the input signal. The input signal is then transmitted by input port transmitters 46 to output port receivers 48. Although all output port receivers 48 receive all RF signals from the input port transmitters 46, they only act upon, or process, those signals that are addressed to them.

Three types of output ports 44 are shown in FIG. 2. Output ports 50 and 50' provide an electrical signal output. Signals received at ports 50 and 50' are decoded from RF and converted into an electrical signal that is sent through a wire to the final destination. Output port 52 provides an optical output. Signals received at port 52 are decoded and converted into an electrical signal that is used to modulate a laser which provides an optical signal to an optical fiber for transmission to the final destination. Output port 54 provides an RF signal output. Signals received at port 54 are decoded and re-encoded for RF transmission to the final destination. It will be understood by those skilled in the art that the switch of FIG. 2 can comprise any combination of types of input ports and output ports, being electrical, optical, RF, infrared or other signal means. When operating as an ATM switch, other ATM switching functions such as connection management and service negotiation are incorporated to control signal flow.

The communication frequency spectrum implemented in any embodiment of the present invention is limited by the amount of RF shielding, the size of the transceiver antennas, and the available bandwidth. Preferably communication occurs in the 2.5 GHz to 5 GHz ISM bands. Distances between circuit components and between circuit boards in most applications range from approximately 1 millimeter to 100 centimeters. Due to the short distances of communications on or between circuit boards, transmission power is low, ranging from less than 1 microwatt to around 1 milliwatt.

It is to be understood that the present invention can be implemented in a variety of configurations. For example, each IC on the circuit board need not communicate with the ATM switch-chip over RF transmissions. Each IC can alternatively be connected to the associated ATM switch-chip on the circuit board through conventional means such as etched copper traces. The ATM switch-chip on the circuit board then communicates with other ATM switch-chips on other circuit boards via RF communications. It is also to be understood that the use of the ATM communication protocol is preferable but not necessary. Other signal routing protocols can also be implemented in accordance with the teachings of the invention.

The present invention eliminates alignment problems, such as encountered with prior art free space optical communications amongst circuit boards. Crosstalk encountered when communications take place over multiple wires at high data transmission rates is also reduced. The present invention also eliminates the requirement that circuit boards be adjacent in order to be connected with wiring or by free space optical communications. Implementation of the communication system of the present invention also reduces the operating temperature of circuit board architectures.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A localized wireless communication system for communication between a plurality of circuit boards, each of the circuit boards having at least one electronic component located on the board, said system comprising a transceiver on each of the circuit boards, said transceiver enabling radio frequency communication between the circuit boards, said system further comprising an asynchronous transfer mode switch locatable on each of the circuit boards, said switch enabling communication via said transceiver between circuit boards in the asynchronous transfer mode protocol.

2. The system of claim 1 wherein each of said asynchronous transfer mode switches use the asynchronous transfer mode private network to network interface protocol between circuit boards.

3. The system of claim 1 further comprising a modulator for modulating electrical signals from the circuit board into signals for radio frequency transmission by said transceiver.

4. The system of claim 3 wherein said modulator comprises a spread spectrum modulator.

5. The system of claim 1 further comprising a demodulator for demodulating radio frequency signals received by said transceiver into electrical signals for the circuit board.

6. The system of claim 1 further comprising at least one component transceiver, each of said component transceiver locatable on an electronic component on a circuit board, said component transceiver enabling radio frequency communication between circuit board components or across circuit boards.

7. The system of claim 6 further comprising an asynchronous transfer mode switch locatable on each of the circuit boards, said switch enabling communication between circuit boards in the asynchronous transfer mode protocol, said switch also enabling communication with electronic components in the asynchronous transfer mode protocol.

8. The system of claim 7 wherein said asynchronous transfer mode switch communicates with the electronic components on the circuit board using the asynchronous transfer mode user to network interface protocol.

9. The system of claim 6 further comprising at least one component modulator associated with each of said component transceiver, for modulating electrical signals from the circuit board into signals for radio frequency transmission by said component transceiver.

10. The system of claim 9 wherein said component modulator comprises a spread spectrum modulator.

11. The system of claim 6 further comprising at least one component demodulator associated with each of said component transceiver, for demodulating radio frequency signals received by said component transceiver into electrical signals for the circuit board.

12. A method of communicating between a plurality of circuit boards, each of the circuit boards having at least one electronic component located on the board, the method comprising:
   transmitting and receiving radio frequency signals to and from transceivers located on each of the circuit boards;
   providing an asynchronous transfer mode switch on each of the circuit boards; and
   communicating between circuit boards in an asynchronous transfer mode protocol.

13. The method of claim 12 wherein communicating between circuit boards in an asynchronous transfer mode protocol comprises communicating in the asynchronous transfer mode private network to network interface protocol between circuit boards.

14. The method of claim 12 further comprising the step of modulating electrical signals from the circuit boards into signals for radio frequency transmission by the transceivers.

15. The method of claim 12 further comprising the step of demodulating radio frequency signals received by the transceivers into electrical signals for the circuit boards.

16. The method of claim 12 further comprising the step of transmitting and receiving radio frequency signals to and from transceivers located on electronic components on the circuit boards.

17. The method of claim 16 wherein the step of transmitting and receiving radio frequency signals to and from transceivers located on electronic components on the circuit boards comprises transmitting and receiving radio frequency signals between electronic components located on a circuit board and transmitting and receiving radio frequency signals between electronic components located on different circuit boards.

18. The method of claim 17 further comprising the steps of
   providing an asynchronous transfer mode switch on each of the circuit boards;
   communicating between circuit boards in an asynchronous transfer mode protocol through the switch; and
   communicating between electronic components on circuits boards in an asynchronous transfer mode protocol through the switch.

19. The method of claim 17 wherein communicating between electronic components on circuits boards in an asynchronous transfer mode protocol through the switch comprises communicating in the asynchronous transfer mode user to network interface protocol through the switch.

* * * * *